(12) United States Patent
Gattere et al.

(10) Patent No.: US 12,050,102 B2
(45) Date of Patent: Jul. 30, 2024

(54) WATERPROOF MEMS BUTTON DEVICE, INPUT DEVICE COMPRISING THE MEMS BUTTON DEVICE AND ELECTRONIC APPARATUS

(71) Applicant: STMICROELECTRONICS S.r.l., Agrate Brianza (IT)

(72) Inventors: Gabriele Gattere, Castronno (IT); Carlo Valzasina, Gessate (IT); Enri Duqi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 844 days.

(21) Appl. No.: 17/025,977

(22) Filed: Sep. 18, 2020

(65) Prior Publication Data

US 2021/0095949 A1  Apr. 1, 2021

(30) Foreign Application Priority Data

Sep. 30, 2019  (IT) ........................ 102019000017546

(51) Int. Cl.
*B81B 7/00* (2006.01)
*G01B 7/16* (2006.01)
(Continued)

(52) U.S. Cl.
CPC .............. *G01B 7/22* (2013.01); *B81B 7/0058* (2013.01); *G01L 1/14* (2013.01); *H01G 5/01* (2013.01);
(Continued)

(58) Field of Classification Search
CPC ......... G01L 1/14; G01L 1/2287; G01L 1/148; G01L 9/0086; G01L 9/0072;
(Continued)

(56) References Cited

U.S. PATENT DOCUMENTS 4,599,896 A    7/1986 Stewart
5,895,850 A    4/1999 Buestgens
(Continued)

FOREIGN PATENT DOCUMENTS

CN    1844935 A    10/2006
CN    101089624 A    12/2007
(Continued)

OTHER PUBLICATIONS

Caspani, A. et al., "A differential resonant micro accelerometer for out-of-plane measurements," Procedia Engineering, vol. 87, pp. 640-643, 2014.

*Primary Examiner* — Tran M. Tran
(74) *Attorney, Agent, or Firm* — Seed IP Law Group LLP (57) ABSTRACT

A button device includes a MEMS sensor having a MEMS strain detection structure and a deformable substrate configured to undergo deformation under the action of an external force. The MEMS strain detection structure includes a mobile element carried by the deformable substrate via at least a first and a second anchorage, the latter fixed with respect to the deformable substrate and configured to displace and generate a deformation force on the mobile element in the presence of the external force; and stator elements capacitively coupled to the mobile element. The deformation of the mobile element causes a capacitance variation between the mobile element and the stator elements. Furthermore, the MEMS sensor is configured to generate detection signals correlated to the capacitance variation.

20 Claims, 10 Drawing Sheets (51) Int. Cl.
*G01L 1/14* (2006.01)
*H01G 5/01* (2006.01)
*H01G 5/16* (2006.01)
*H01H 1/00* (2006.01)
*H03K 17/975* (2006.01)
*G06F 3/044* (2006.01)

(52) U.S. Cl.
CPC ............ *H01G 5/16* (2013.01); *H01H 1/0036* (2013.01); *H03K 17/975* (2013.01); *B81B 2201/0221* (2013.01); *B81B 2201/0292* (2013.01); *B81B 2203/0154* (2013.01); *B81B 2203/0181* (2013.01); *B81B 2203/0307* (2013.01); *B81B 2203/04* (2013.01); *B81B 2203/056* (2013.01); *B81B 2207/012* (2013.01); *G06F 3/044* (2013.01)

(58) Field of Classification Search
CPC ...... B81B 2203/056; B81B 2201/0221; B81B 7/0027; B81B 2201/025; B81B 2201/0264; B81B 2201/0292; H01H 2001/0078; H01H 2001/0084
See application file for complete search history.

(56) References Cited

U.S. PATENT DOCUMENTS

| | | | |
|---|---|---|---|
| 6,044,705 A | 4/2000 | Neukermans et al. | |
| 6,481,283 B1 | 11/2002 | Cardarelli | |
| 6,539,803 B2 | 4/2003 | Mochida | |
| 6,584,845 B1 | 7/2003 | Gutierrez et al. | |
| 6,691,571 B2 | 2/2004 | Willig et al. | |
| 6,845,669 B2 | 1/2005 | Acar et al. | |
| 6,860,150 B2 | 3/2005 | Cho | |
| 6,955,086 B2 | 10/2005 | Yoshikawa et al. | |
| 7,066,004 B1 | 6/2006 | Kohler et al. | |
| 7,123,111 B2 * | 10/2006 | Brunson | G01C 19/5684 73/504.12 |
| 7,426,861 B2 | 9/2008 | Weinberg et al. | |
| 7,513,155 B2 | 4/2009 | Jeong et al. | |
| 7,640,786 B2 | 1/2010 | Stewart | |
| 7,694,563 B2 | 4/2010 | Durante et al. | |
| 7,797,998 B2 | 9/2010 | Menard et al. | |
| 8,042,396 B2 | 10/2011 | Coronato et al. | |
| 8,215,168 B2 | 7/2012 | Merz et al. | |
| 8,261,614 B2 | 9/2012 | Hartmann et al. | |
| 8,297,121 B2 | 10/2012 | Quer et al. | |
| 8,342,022 B2 | 1/2013 | Schmid et al. | |
| 8,365,597 B2 | 2/2013 | Akashi et al. | |
| 8,459,110 B2 | 6/2013 | Cazzaniga et al. | |
| 8,539,832 B2 | 9/2013 | Potasek et al. | |
| 8,539,835 B2 | 9/2013 | Seeger et al. | |
| 8,549,917 B2 | 10/2013 | Cazzaniga et al. | |
| 8,621,928 B2 | 1/2014 | Gotoh | |
| 8,661,897 B2 | 3/2014 | Coronato et al. | |
| 8,733,172 B2 | 5/2014 | Coronato et al. | |
| 8,833,164 B2 | 9/2014 | Coronato et al. | |
| 8,875,578 B2 | 11/2014 | Smith | |
| 8,950,257 B2 | 2/2015 | Cazzaniga et al. | |
| 9,010,184 B2 | 4/2015 | Zou et al. | |
| 9,075,079 B2 | 7/2015 | Yoneoka et al. | |
| 9,151,611 B2 | 10/2015 | Coronato et al. | |
| 9,194,704 B2 | 11/2015 | Lin et al. | |
| RE45,855 E | 1/2016 | Coronato et al. | |
| 9,234,913 B2 | 1/2016 | Simoni et al. | |
| 9,290,067 B2 * | 3/2016 | McNeil | B60C 23/0408 |
| 9,310,199 B2 | 4/2016 | Schofield et al. | |
| 9,310,202 B2 | 4/2016 | Lin | |
| 9,341,646 B2 | 5/2016 | Stewart | |
| 9,383,285 B2 * | 7/2016 | Phan Le | G01L 11/04 |
| 9,389,077 B2 | 7/2016 | Comi et al. | |
| 9,404,747 B2 | 8/2016 | Valzasina et al. | |
| 9,453,927 B2 | 9/2016 | Heitz et al. | |
| 9,455,354 B2 * | 9/2016 | Acar | G01P 15/18 |
| 9,651,375 B2 | 5/2017 | Kuhlmann et al. | |
| 9,664,515 B2 | 5/2017 | Rocchi | |
| 9,689,677 B2 | 6/2017 | Shao et al. | |
| 9,696,157 B2 | 7/2017 | Falorni et al. | |
| 9,878,903 B2 | 1/2018 | Lasalandra et al. | |
| 9,916,942 B2 * | 3/2018 | Shedletsky | H01H 13/06 |
| 9,958,270 B2 | 5/2018 | Blomqvist | |
| 9,989,364 B2 | 6/2018 | Comi et al. | |
| 10,549,982 B2 * | 2/2020 | Duqi | G01L 9/0054 |
| 10,551,191 B2 * | 2/2020 | Laghi | G01C 19/5747 |
| 10,623,866 B2 | 4/2020 | Cerini et al. | |
| 10,683,200 B2 | 6/2020 | Paci et al. | |
| 10,691,211 B2 * | 6/2020 | Amin-Shahidi | G06F 3/016 |
| 10,961,116 B2 * | 3/2021 | Meinhold | B81C 3/001 |
| 11,051,113 B2 | 6/2021 | Cerini et al. | |
| 11,524,414 B2 * | 12/2022 | Nakayama | G01L 1/148 |
| 2006/0112764 A1 | 6/2006 | Higuchi | |
| 2008/0236242 A1 | 10/2008 | Stewart | |
| 2008/0237757 A1 | 10/2008 | Inoue et al. | |
| 2014/0116136 A1 | 5/2014 | Coronato et al. | |
| 2014/0174183 A1 | 6/2014 | Comi et al. | |
| 2014/0252509 A1 * | 9/2014 | Merassi | B81B 3/0072 257/415 |
| 2014/0285871 A1 | 9/2014 | Moidu | |
| 2015/0092345 A1 | 4/2015 | Ely | |
| 2016/0084872 A1 * | 3/2016 | Naumann | G01P 15/18 73/514.01 |
| 2016/0225551 A1 | 8/2016 | Shedletsky | |
| 2017/0108530 A1 * | 4/2017 | Tocchio | G01P 1/00 |
| 2017/0108986 A1 | 4/2017 | Lai et al. | |
| 2017/0233245 A1 * | 8/2017 | Duqi | B81B 7/0041 257/419 |
| 2017/0261322 A1 | 9/2017 | Gattere et al. | |
| 2017/0284804 A1 | 10/2017 | Gattere et al. | |
| 2018/0052011 A1 | 2/2018 | Oshima et al. | |
| 2018/0112981 A1 * | 4/2018 | Tocchio | G01C 19/5747 |
| 2018/0339898 A1 | 11/2018 | Gattere et al. | |
| 2020/0095114 A1 | 3/2020 | Pomarico et al. | |
| 2022/0301789 A1 | 9/2022 | Duqi et al. | |
| 2023/0050748 A1 | 2/2023 | Silvestre | |

FOREIGN PATENT DOCUMENTS

| | | |
|---|---|---|
| CN | 101270988 A | 9/2008 |
| DE | 10 2007 027 652 A1 | 12/2008 |
| EP | 0390721 A1 | 10/1990 |
| EP | 1975631 A2 | 10/2008 |
| EP | 3147258 A1 | 3/2017 |
| EP | 3 407 492 A1 | 11/2018 |
| EP | 3441358 A1 | 2/2019 |
| WO | WO 03031317 A2 | 4/2003 |

* cited by examiner

WATERPROOF MEMS BUTTON DEVICE, INPUT DEVICE COMPRISING THE MEMS BUTTON DEVICE AND ELECTRONIC APPARATUS

BACKGROUND

Technical Field

The present disclosure relates to a waterproof MEMS (MicroElectroMechanical Systems) button device, to an input device comprising the MEMS button device and to an electronic apparatus. Specifically, hereinafter reference is made to a button that can be operated by a user for generating an electrical signal used by the electronic apparatus for its operation.

Description of the Related Art

As is known, input devices, such as keys, buttons, or switches for portable electronic apparatuses, such as smartphones and smartwatches, are typically physical touch elements that enable the user to provide signals to the portable electronic apparatus. For instance, the pressure applied on a button of a smartphone enables a user to reactivate the screen thereof, when in stand-by mode.

Known input devices comprise strain sensors, which exploit different physical principles for detecting the command issued by the user; for example, known strain sensors are piezoresistive sensors, which detect a user command via a resistance variation caused by the application of an external force on the input device itself (for example, pressure on the button).

Currently, it is increasingly more desirable for input devices to be impermeable to fluids, usually water, to prevent the portable electronic apparatus from failing due to infiltration of fluid or to enable use of the apparatus under water, for example when practicing aquatic sports.

For this purpose, currently waterproof input devices are provided with sealing elements, for example O-rings, integrated during assembly of the portable electronic apparatuses, which prevent entry of the water into the portable electronic apparatus.

An example of an input device comprising an O-ring is described in the U.S. patent US 2015/0092345 A1.

A further example of a known input device is described in the U.S. patent US 2016/0225551 A1, which discloses a portable electronic apparatus comprising a physical button as input device. Here, the button comprises a cap, mobile in an enclosure of the portable electronic apparatus, a flexible element, coupled to the cap, and a stress sensor, coupled to the flexible element. In use, an external force (for example, due to the pressure exerted by the user's finger on the cap) deflects the flexible element, thus generating a corresponding stress in the stress sensor, which generates an electrical signal and supplies it to a processing element.

BRIEF SUMMARY

One or more embodiments of the present disclosure overcome one or more of the drawbacks of the prior art.

According to the present disclosure a button device, an input device, and an electronic apparatus are provided.

BRIEF DESCRIPTION OF THE SEVERAL VIEWS OF THE DRAWINGS

For a better understanding of the present disclosure, embodiments thereof are now described purely by manner of non-limiting example, with reference to the attached drawings, wherein.

DETAILED DESCRIPTION

The inventor recognized that in portable apparatuses it is desirable for input devices to present a predefined travel and a waterproofing durable in time, as well as small dimensions.

However, the growing trend to miniaturisation of portable electronic apparatuses is frequently incompatible with current waterproof assemblages of input devices; for example, current O-rings have non-negligible dimensions, which may interfere with the miniaturisation requirement. In order to reconcile waterproofing and small dimensions, known current input devices for portable electronic apparatuses are complex both to manufacture and to assemble.

In addition, current sealing elements are subject to wear, for example on account of repeated stresses of the input device, as well as to ageing, with a reduction of the waterproofing capacity of the sealing elements.

Furthermore, known input devices usually have high power-consumption levels, which may significantly reduce the battery life of the portable electronic apparatus.

The present disclosure relates to a MEMS (Micro-Electro-Mechanical Systems) button device, to an input device comprising the MEMS button device and to an electronic apparatus. Specifically, hereinafter reference is made to a button that can be operated by a user for generating an electrical signal used by the electronic apparatus for its operation.

Figure 1:
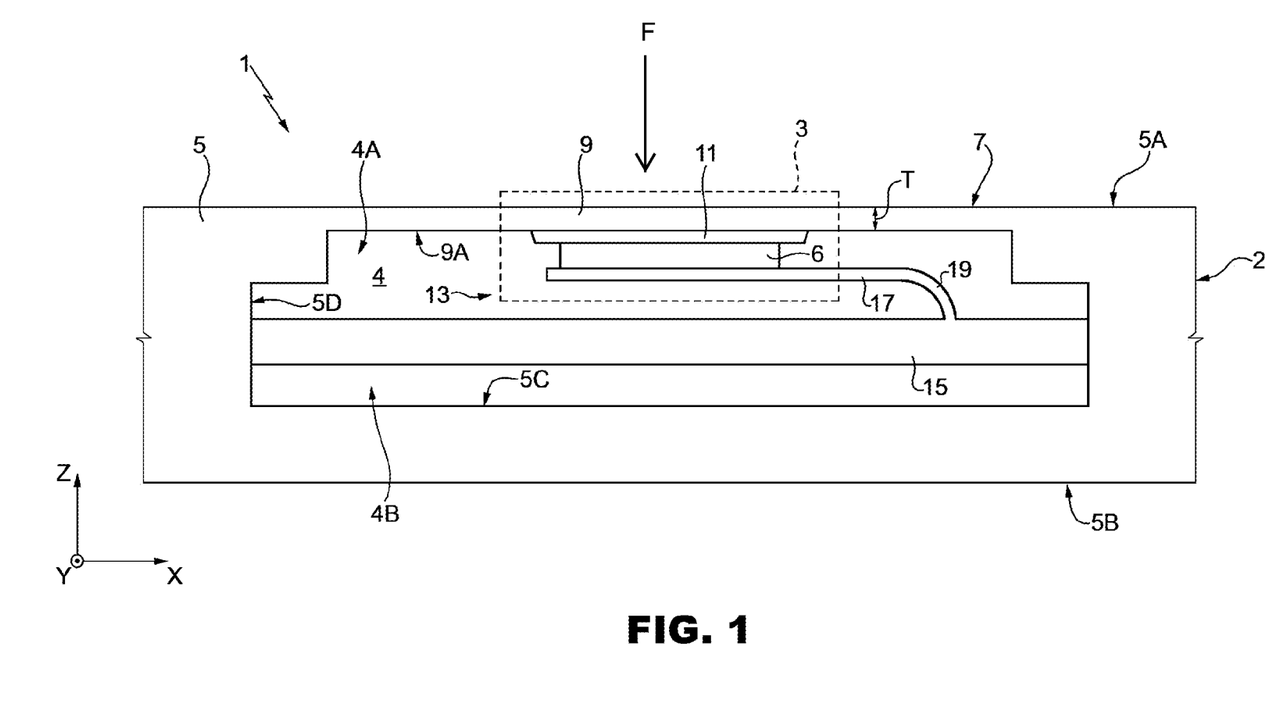
FIG. 1 shows a cross-section of the simplified structure of the present input device mounted in a portable electronic apparatus.

FIG. 1 shows a portion of a portable electronic apparatus 1 comprising an enclosure 2. For instance, the enclosure 2 is constituted by a seat in a housing, for example of aluminium, of the portable electronic apparatus 1 and accommodates an input device 3 (represented in FIG. 1 by a box with a dashed outline).

In some embodiments, in the area of the enclosure 2, the portable electronic apparatus 1 has a wall 5 having a first and a second surface 5A, 5B, opposite to one another, and has a cavity 4, configured to accommodate a MEMS device 6.

The wall 5 comprises a deformable portion 7, extending over the cavity 4 and forming a membrane 9, having a membrane surface 9A facing the cavity 4. The wall 5 has a small thickness so as to have a high flexibility as well as good sensitivity to external forces F acting on the deformable portion 7.

The cavity 4 (for example, of a parallelepipedal or cylindrical shape) has a first base surface formed by the membrane surface 9A, a second base surface (also referred to as bottom surface 5C), extending parallel to the first and the second surface 5A, 5B, and a side surface 5D. A first board 15 extends within the cavity 4, approximately parallel to the first and second surfaces 5A, 5B, is fixed to the side surface 5D and divides the cavity 4 itself into a first cavity portion 4A, adjacent to the membrane surface 9A, and a second cavity portion 4B, adjacent to the bottom surface 5C.

The MEMS device 6 is accommodated in the first cavity portion 4A and is glued to the membrane surface 9A of the membrane 9 by an adhesive layer 11 (for example, of glue or a die-attach film, DAF).

The first board 15 forms part of a connection structure 13 of flexible material (for example, a material normally used for the printed-circuit boards, such as Kapton, polyimide, or PVC), arranged in the cavity 4 and physically and electrically coupled to the MEMS device 6. In addition, the connection structure 13 comprises a second board 17, accommodated in the first cavity portion 4A and fixed to the MEMS device 6 on a side of the latter not coupled to the membrane surface 9A; and a connector 19, which physically and electrically connects the first and second boards 15, 17. The first board 15, which is also, for example, of a material normally used for printed-circuit boards, but more rigid, for example FR4 glass-reinforced epoxy laminate material, can accommodate a plurality of electronic components (not shown), electrically coupled to the MEMS device 6 by conductive paths (not shown) passing through the boards 15, 17 as well as in the connector 19.

Figure 2:
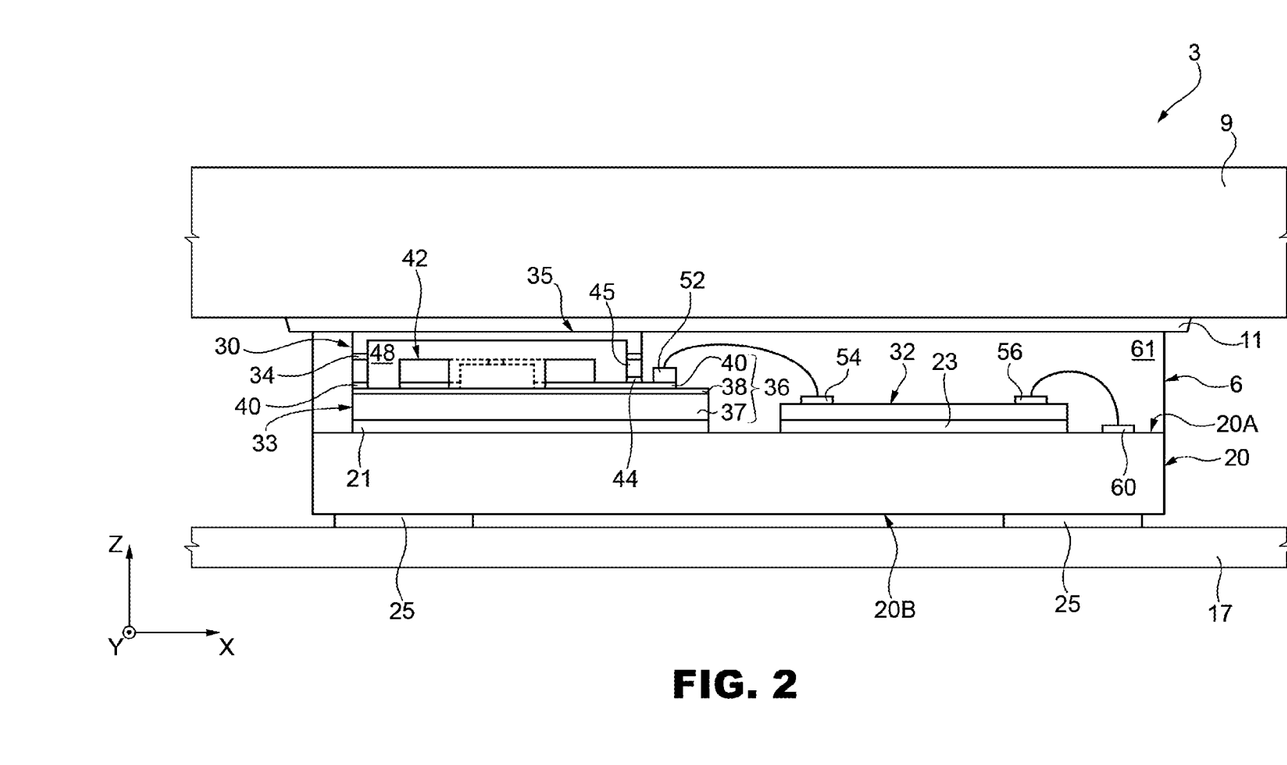
FIG. 2 shows a more detailed cross-section of the input device of FIG. 1, including a MEMS sensor.

FIG. 2 shows the input device 3 in greater detail.

In some embodiments, the MEMS device 6 comprises: a supporting substrate 20; a MEMS sensor 30, e.g., a capacitive strain sensor; and a processing circuit 32, for example an ASIC (Application-Specific Integrated Circuit).

The supporting substrate 20 has a top surface 20A and a bottom surface 20B, opposite to one another (where "top" and "bottom" refer to the arrangement shown in FIG. 2); the MEMS sensor 30 and the processing circuit 32 are manufactured as separate devices, each integrated in a respective die of semiconductor material and fixed to the top surface 20A of the supporting substrate 20 by a first insulating layer 21 and a second insulating layer 23, respectively.

In some embodiments, the supporting substrate 20 is, for example, a multi-layer printed-circuit board of an LGA (Land Grid Array) type, comprising layers and interconnection vias (not shown), of conductive material (for example, copper, Cu, or else aluminium, Al) and embedded in insulation layers (not shown) of dielectric material (for example, silicon oxide, $SiO_2$).

The supporting substrate 20 carries first connection pads 25, of conductive material (for example, copper or aluminium), extending on the bottom surface 20B and electrically coupling the supporting substrate 20 to the second board 17.

The MEMS sensor 30 comprises an active portion 33, coupled to the first insulating layer 21; and a cap 35, bonded to the active portion 33 by a gluing layer 34.

The active portion 33 comprises a body 36, a MEMS structure 42, and a wall region 45.

The body 36 is formed by an epitaxial substrate 37, of semiconductor material (for example, silicon), extending over which is a first insulating layer 38, for example of silicon oxide ($SiO_2$), housing connection regions 40, for example, of polysilicon, electrically coupled to conductive paths (not shown) of the connection structure 13.

The MEMS structure 42 is coupled to the conduction regions 40 in the manner described hereinafter and is configured to receive biasing voltages from the latter.

The wall region 45 surrounds the MEMS structure 42 and is fixed to the conduction regions 40 by a second insulating layer 44, for example of silicon oxide, and to the first insulating layer 38.

The cap 35 is, for example, of semiconductor material such as silicon and defines, together with the wall region 45, a MEMS cavity 48 that accommodates the MEMS structure 42.

A first pad 52, of conductive material, extends on a portion of the body 36, in electrical contact with the conduction regions 40. The first pad 52 is wired to a second pad 54, of conductive material, extending on the processing circuit 32 to electrically couple the MEMS structure 42 to the processing circuit 32.

A third pad 56, of conductive material, extends on the processing circuit 32 and is electrically wired to second connection pads 60, extending on the top surface 25A of the substrate 25 and in turn being electrically coupled to the first contact pads 25 in a manner not shown.

An encapsulation mass 61, for example of resin, surrounds and embeds the MEMS sensor 30 and the processing circuit 32 to protect them from the external environment, except for the top surface of the cap 35, in contact with the adhesive layer 11 and therefore operatively and dynamically coupled to the membrane 9.

Figure 3:
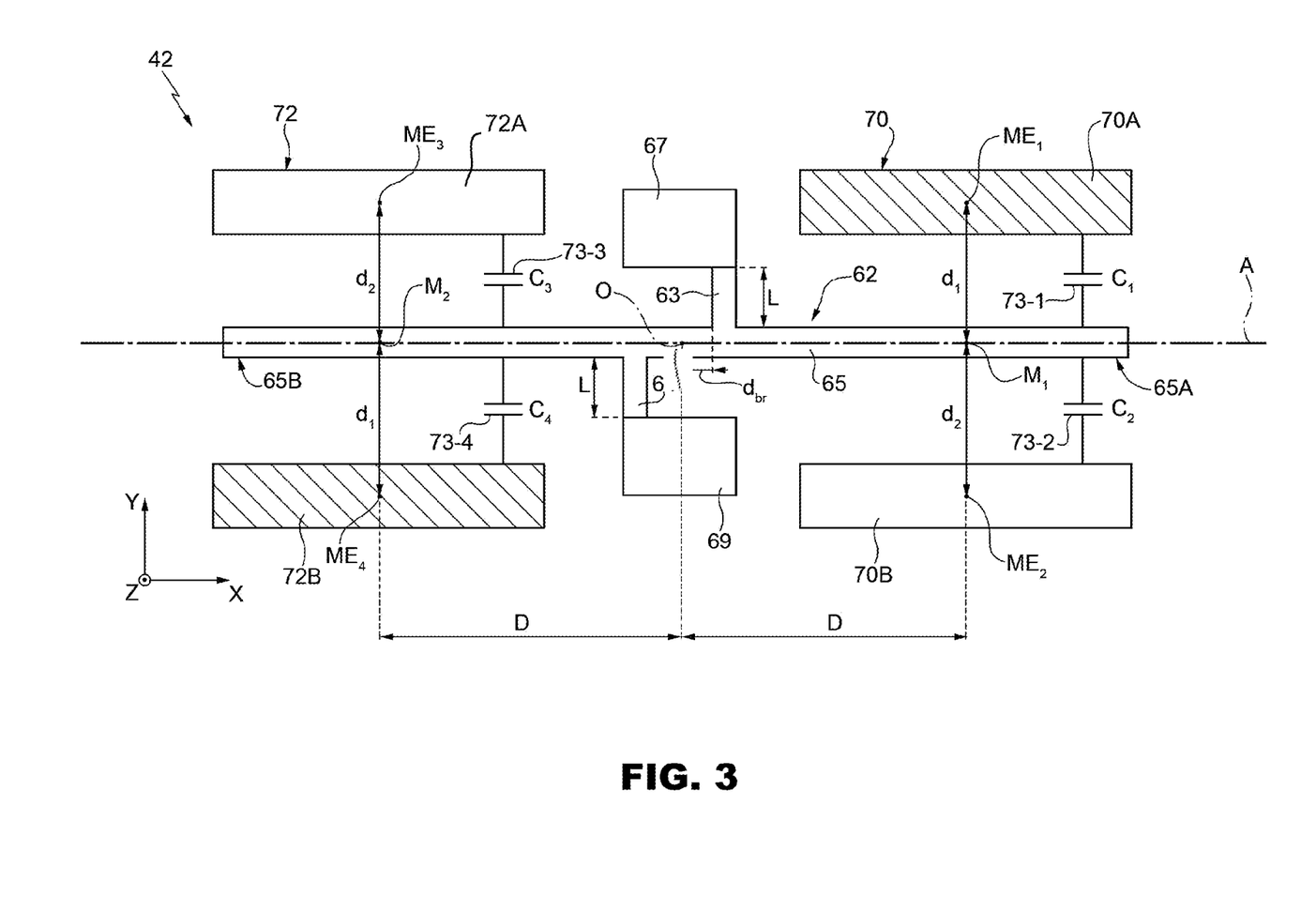
FIG. 3 shows a schematic illustration of the structure of the MEMS sensor of FIG. 2, in top view and in a resting condition.

FIG. 3 shows an embodiment of the MEMS structure 42.

The MEMS structure 42 comprises a suspended structure 62 formed by a beam 65, a first arm 63, and a second arm 64, and anchored to the epitaxial substrate 37 (FIG. 2) via a first and a second anchorage 67, 69.

In detail, here the beam 65 extends parallel to a second axis X of the cartesian coordinate system XYZ and has a centroidal axis O, parallel to a first axis Z of the cartesian coordinate system XYZ.

The first and second arms 63, 64 extend in a direction transverse to the beam 65, parallel to a third axis Y of the cartesian coordinate system XYZ, and are rigid, at a first end thereof, with the first and, respectively, the second anchorage 67, 69 and, at a second end thereof, with respect to the beam 65 in two points of the latter set at a distance from the centroidal axis O of the beam 65. In some embodiments, the arms 63, 65 are equal with each another, i.e., they have the same dimensions (in some embodiments the same length L along the third axis Y) and the same weight, extend at the same distance $d_{br}$ from the centroidal axis O, and are anchored in a symmetrical way (with respect to the centroidal axis O) to the respective anchorages 67, 69. Consequently, the suspended structure 62 has a rotational symmetry of 180° with respect to the centroidal axis O, and this also constitutes a rotation axis of the suspended structure 62.

The anchorages 67, 69 are fixed to respective portions of the conduction regions 40 for the biasing of the suspended structure 62.

The beam 65 comprises a first half beam 65A and a second half beam 65B and, in a resting condition (FIG. 3), extends along a rest axis A, perpendicular to the centroidal axis O.

The MEMS structure 42 further comprises a first, a second, a third and a fourth electrode 70A, 70B, 72A, 72B, of conductive material, for example silicon, capacitively coupled to the first and, respectively, the second half beam 65A, 65B, carried by the epitaxial substrate 37 and coupled to respective conduction regions 40.

In detail, the first and second electrodes 70A, 70B are arranged on opposite sides of the first half beam 65A, and the third and fourth electrodes 72A, 72B are arranged on opposite sides of the second half beam 65B. At rest, the electrodes 70A, 70B, 72A, and 72B extend parallel to the beam 65.

Denoting as $M_1$ the centroid of the portion of the beam 65 facing the first and second electrodes 70A, 70B in a resting condition (first partial centroid $M_1$), $M_2$ the centroid of the portion of the beam 65 facing the third and fourth electrodes 72A, 72B (second partial centroid $M_2$), $ME_1$-$ME_4$ the centre of the surfaces of the electrodes 70A, 70B, 72A, 72B facing the beam 65, $d_1$ the distance between the partial centroids $M_1$ and $M_2$ and the surface centres $ME_1$, $ME_4$ of the first and fourth electrodes 70A, 72B, and $d_2$ the distance between the partial centroids $M_1$ and $M_2$ and the surface centres $ME_2$, $ME_3$ of the second and third electrodes 70B, 72A, in a resting condition (FIG. 3), one has $d_1=d_2=d$.

In practice, the electrodes 70A, 70B, 72A and 72B form, with the beam 65, plates of a first, a second, a third and a fourth capacitor 73-1, 73-2, 73-3, 73-4, having respective capacitances $C_1$, $C_2$, $C_3$ and $C_4$, wherein the first capacitor 73-1 and the fourth capacitor 73-4 are in parallel and have a first equivalent capacitance $CE_1$, and the second capacitor 73-2 and the third capacitor 73-3 are in parallel and have a second equivalent capacitance $CE_2$.

In use, the electrodes 70A, 70B, 72A, and 72B and the beam 65 are biased at respective biasing voltages by the conduction regions 40. For instance, the electrodes 70A, 70B, 72A, and 72B are biased at a first DC voltage $V_1$ having a value comprised, for example, between 0.7 V and 1 V.

In addition, the beam 65 is biased at a second voltage $V_2$, having a DC component $V_{DC}$, of, for example, between 0.7 V and 1 V, and an AC component $V_{AC}$, for example a square wave switching between 0.7 V and 1 V.

As a result of biasing of the electrodes 70A, 70B, 72A, 72B and of the beam 65, the beam 65 is subjected to a total electrostatic force $F_{el}$, given by the sum of a first electrostatic force $F_{el1}$ (force acting between the beam 65 and the first and fourth electrodes 70A, 72B) and a second electrostatic force $F_{el2}$ (force acting between the beam 65 and the second and third electrodes 70B, 72A). As indicated above, in the resting condition, the first and second distances $d_1$, $d_2$ are equal with each another; consequently, the capacitances $C_1$, $C_2$, $C_3$, $C_4$ are equal with each another, as are the equivalent capacitances $CE_1$, $CE_2$, and the electrostatic forces $F_{el1}$, $F_{el2}$ are also equal with each another.

Figure 4:
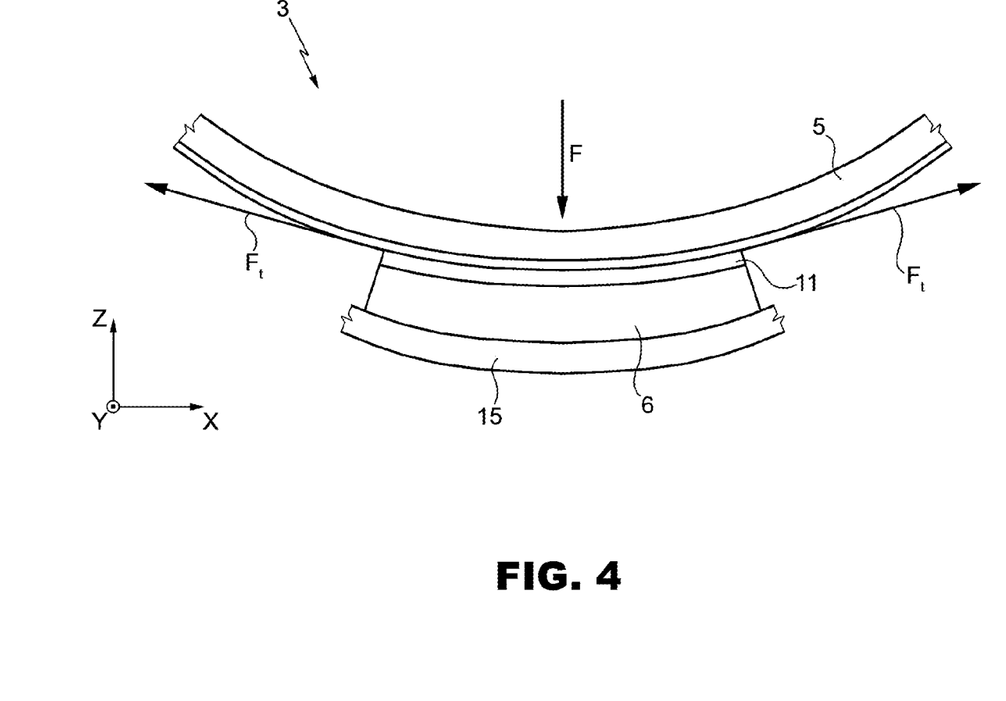
FIG. 4 shows a schematic illustration of a part of the input device, in cross-section view and in a stressed position.

When the external force F acts on the deformable portion 7 of the portable electronic apparatus 1, FIG. 4, the membrane 9 deflects towards the inside of the cavity 4 together with the rest of the MEMS device 6, and in some embodiments with the encapsulation mass 61, the cap 35, and the active portion 33 of the MEMS sensor 30, as well as with the second board 17, substantially operating as a single body. Deformation of the MEMS device 6 leads to generation of a tensile force $F_t$ on the anchorages 67, 69, which therefore tend to displace with respect to the centroidal axis O, together with the arms 63, 64. The arms 63, 64, due to their eccentric fixing to the beam 65, generate a torque of forces that causes the deformation and the rotation of the beam 65 itself, here in a counter-clockwise direction, about the centroidal axis (axis of rotation) O.

Figure 5:
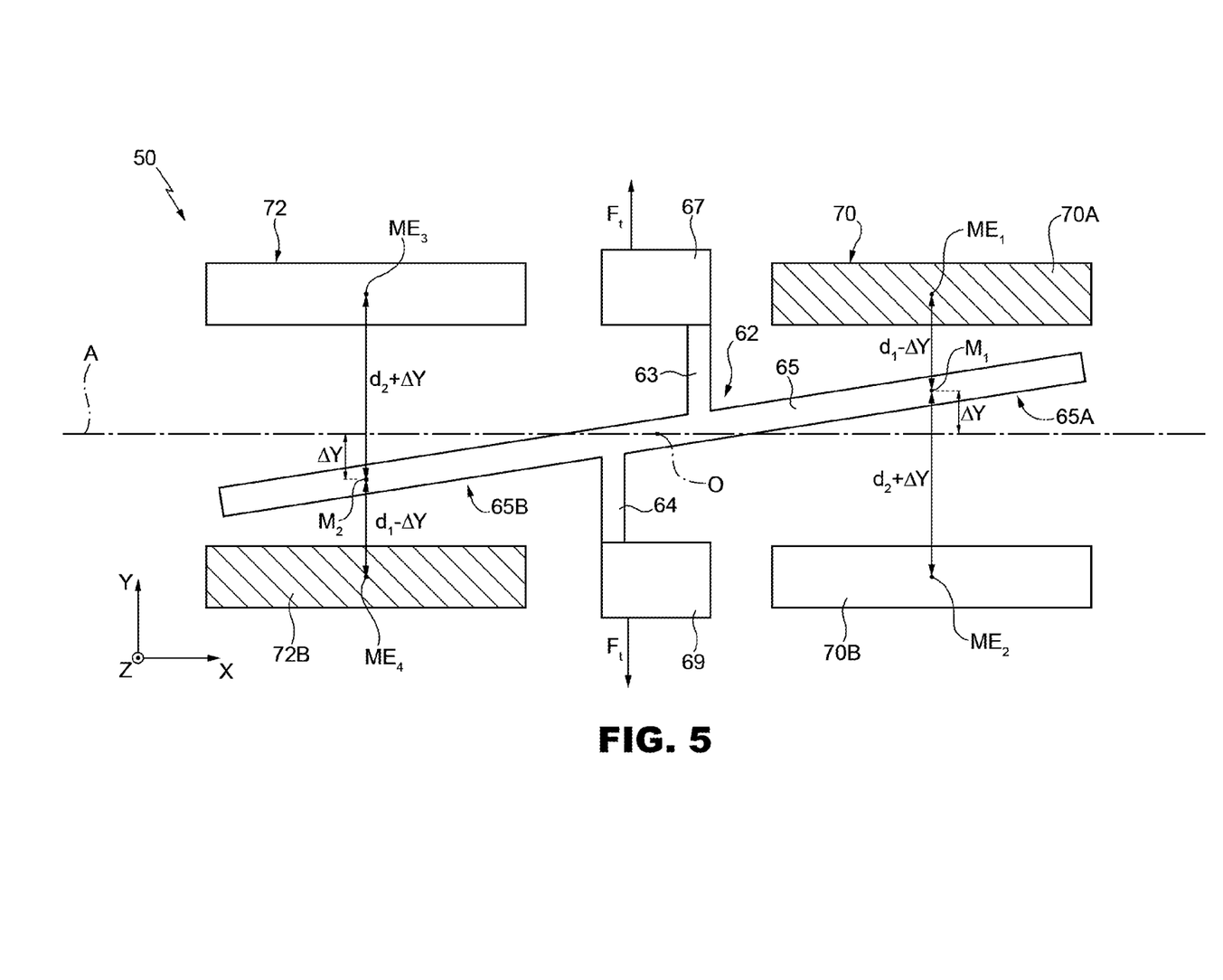
FIG. 5 is a top view similar to that of FIG. 3, illustrating the structure of the MEMS sensor in the stressed condition of FIG. 4.

With reference to FIG. 5, the rotation of the beam 65 about the centroidal axis O determines a variation of position of the beam 65 with respect to the electrodes 70A, 70B, 72A, 72B. In some embodiments, in the case of rotation in the counter-clockwise direction shown in FIG. 5, the beam 65 moves towards the first electrode 70A and the fourth electrode 72B and moves away from the second electrode 70B and the third electrode 72A.

In some embodiments, denoting as $\Delta Y$ the displacement of the first and second centroids $M_1$ and $M_2$ with respect to the resting position (FIG. 3), the distance between the first centroid $M_1$ and the surface centre $ME_1$ of the first electrode 70A (as well as between the second centroid $M_2$ and the surface centre $ME_4$ of the fourth electrode 72B) becomes $d_1-\Delta Y$; likewise, the distance between the first centroid $M_1$ and the surface centre $ME_2$ of the second electrode 70B (as well as between the second centroid $M_2$ and the surface centre $ME_3$ of the third electrode 72A) becomes $d_2+\Delta Y$.

It is noted that, in this step, also the fixed electrodes 70A, 70B, 72A, 72B displace a little, but the amplitude of this displacement is reduced by the amplification factor of the mechanical lever (beam 65—arms 63 and 64) and is therefore negligible. Moreover, said displacement amplitude (further variation of distance) is the same for all the electrodes (70A, 70B, 72A, 72B); given that, as discussed below, a capacitive differential reading is carried out, said variation does not affect the useful output signal. Possible second-order effects, such as a variation of sensitivity as a function of the load (non-linearity factors) are also demultiplied by the mechanical amplification factor.

It follows that the equivalent capacitances $CE_1$, $CE_2$ and the electrostatic forces $F_{el1}$, $F_{el2}$ are no longer the same. In some embodiments, the first equivalent capacitance $CE_1$ and the first electrostatic force $F_{el1}$ increase, and the second equivalent capacitance $CE_2$ and the second electrostatic force $F_{el2}$ decrease.

Consequently, the MEMS sensor 30 generates a first capacitance signal $s_{C1}$ and a second capacitance signal $s_{C2}$, indicative of the variations of the first and, respectively, the second equivalent capacitances $CE_1$, $CE_2$ and which are then transmitted to the processing circuit 32.

Figure 6:
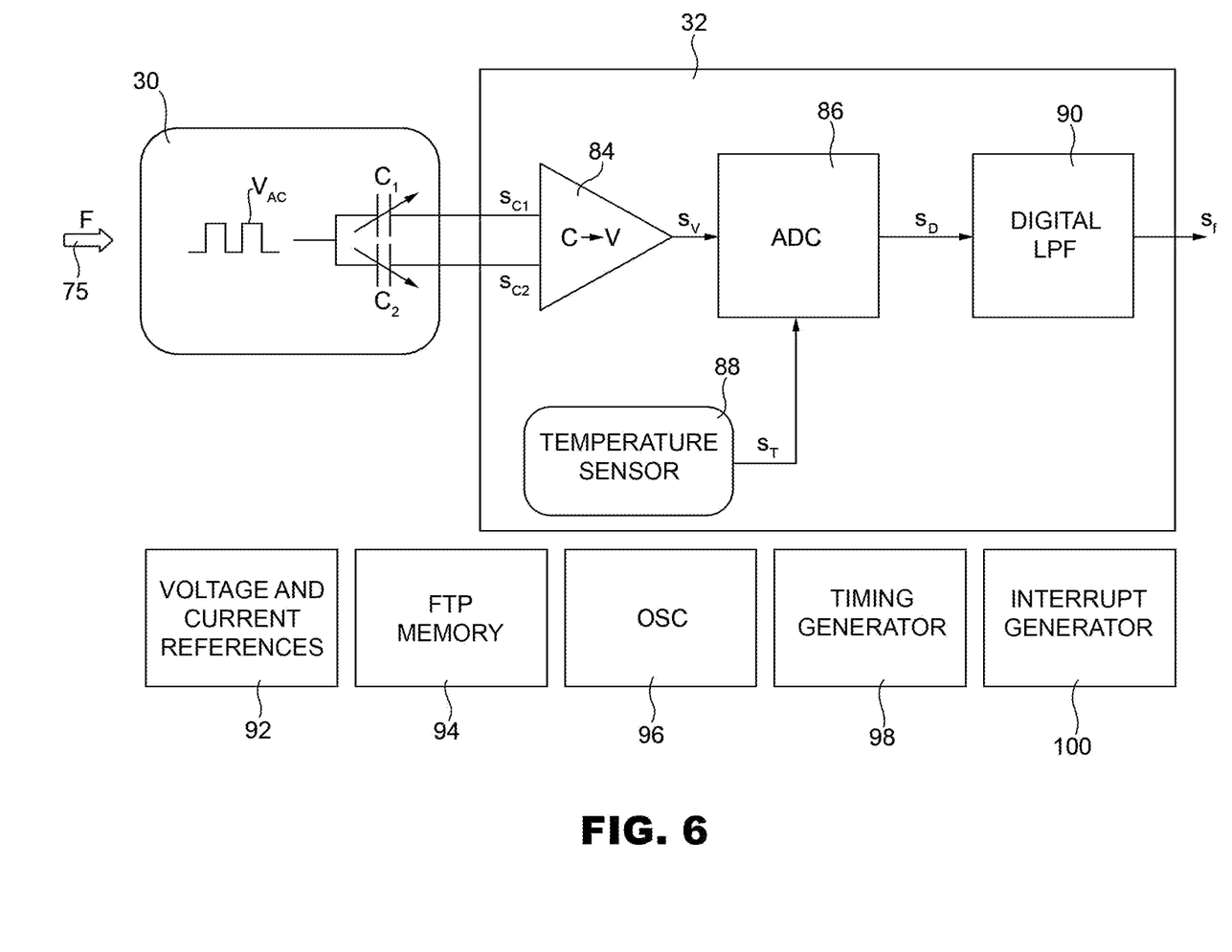
FIG. 6 is a simplified block diagram of a circuit for processing the signal supplied by the input device of FIG. 2, according to an embodiment.

The MEMS sensor 30 and the processing circuit 32 are schematically represented in the block diagram of FIG. 6 as MEMS block 30 and, respectively, an ASIC block 32.

In detail, the ASIC block 32 comprises an input stage 84, in some embodiments a capacitance-to-voltage converter, configured to receive the first and second capacitance signals $s_{C1}$, $s_{C2}$ and generate an output signal $s_V$ (for example, a voltage signal) proportional to a capacitance variation $\Delta C$ equal to the difference between the equivalent capacitances $CE_1$ and $CE_2$.

For this purpose, denoting as $\Delta L$ the displacement of the anchorages 67, 69 as a result of the tensile force $F_t$, one has $$\Delta L = \varepsilon_Y L \tag{1}$$

wherein $\varepsilon_Y$ is a tensile deformation coefficient, and L is, as previously described and shown in FIG. 3, the length of the arms 63, 64. The relation between the displacement ΔL and the external force F acting on the deformable portion 7 of the portable electronic apparatus 1 is on the other hand complex and can be determined, for example, on the basis of FEA ("Finite Element Analysis") type simulations.

The capacitance variation can therefore be determined as described hereinafter. The displacement ΔY of the first and second centroids $M_1$ and $M_2$ with respect to the resting position (FIG. 3) is linked to ΔL by the following equation:

$$\Delta Y = \frac{D}{d_{br}} \cdot \Delta L, \quad (2)$$

wherein D is the distance between the centroidal axis O and the first centroid $M_1$ (as well as between the centroidal axis O and the second centroid $M_2$), ΔL has the meaning indicated in relation to Eq. (1), and $d_{br}$ is, as previously described and shown in FIG. 3, the distance between the arms 63, 64 and the centroidal axis O.

Consequently, the capacitance variation ΔC, referred to as the difference between the equivalent capacitances $CE_1$, $CE_2$, is defined as follows:

$$CE_1 - CE_2 = \Delta C = \varepsilon A \cdot \left( \frac{1}{d - \Delta Y} - \frac{1}{d + \Delta Y} \right) \approx \frac{2\varepsilon A}{d^2} \Delta Y, \quad (3)$$

wherein ε is the dielectric constant, A is the area of the electrodes 70, 72, d and ΔY have the meaning indicated above. It is moreover verified that the capacitance variation ΔC is linearly proportional to the external force F applied on the deformable portion 7 of the portable electronic apparatus 1.

The ASIC block 82 further comprises an analog-to-digital conversion stage (ADC) 86, configured to receive the output signal $s_V$ from the input stage 84; and a temperature sensor 88, coupled to the analog-to-digital conversion stage 86 and supplying to the latter a temperature signal $s_T$, relative to the thermal conditions in which the input device 3 is operating. On the basis of the output signal $s_V$ and of the temperature signal $s_T$, the conversion stage 86 generates a temperature-compensated digital signal $s_D$ in a per se known manner.

The ASIC block 32 further comprises a filtering stage 90, for example a lowpass digital filter (LPF), configured to receive and filter the digital signal $s_D$ generated by the conversion stage 86 to generate a filtered signal $s_f$ transmitted to other devices associated to the apparatus 1, for example to the electronic components carried by the first board 15 (FIG. 1).

The MEMS block 30 and the ASIC block 32 are further coupled to further electronic components (schematically represented in FIG. 6), such as a voltage-and-current-generation unit 92, an FTP (Few-Time Programmable) memory 94, an oscillator element 96, a timing generator 98, and an interrupt generator 100.

Figure 7:
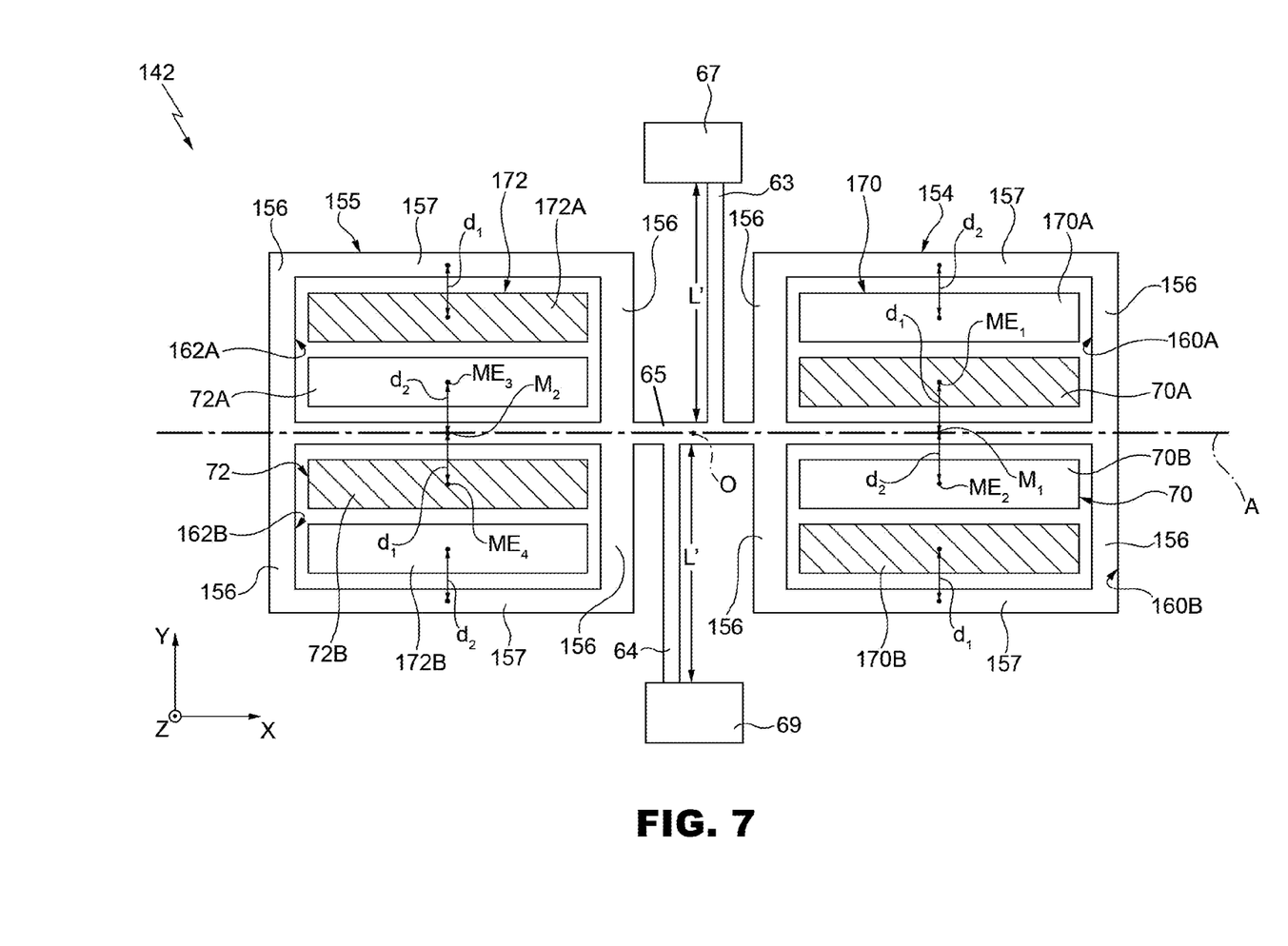
FIG. 7 is a schematic illustration of the structure of the MEMS sensor of FIG. 2, in top view and in a resting position according to another embodiment.

FIG. 7 shows another embodiment of the MEMS structure of the present input device. In detail, FIG. 7 shows a MEMS structure 142 having a general structure similar to that of the MEMS structure 42 shown in FIGS. 3-5 so that parts that are similar to the ones shown and described with reference to FIGS. 3-5 are designated in FIG. 7 by the same reference numbers and will be briefly described.

In detail, the MEMS structure 142 comprises the beam 65 and the arms 63, 64 fixed to the anchorages 67, 69. Moreover, the MEMS structure 142 comprises a first and a second frame structure 154, 155, having a quadrangular, for example, rectangular, shape and being rigid with the beam 65, in some embodiments the first and, respectively, the second half beam 65A, 65B. In some embodiments, the frame structures 154, 155 comprise transverse sides 156, which are, in some embodiments, perpendicular to the beam 65, and longitudinal sides 157, which are parallel to the beam 65. The frame structures 154, 155 surround a respective end of the first and second half beams 65A, 65B and define a first, a second, a third and a fourth opening 160A, 160B, 162A, 162B, having a quadrangular (for example, rectangular) shape and surrounding the first, second, third, and fourth electrodes 70A, 70B, 72A, 72B, respectively.

The MEMS structure 142 of FIG. 7 further comprises four electrodes 170A, 170B, 172A and 172B, hereinafter referred to as fifth, sixth, seventh and eighth electrode 170A, 170B, 172A, 172B. The further electrodes each extend in a respective opening 160A, 160B, 162A, 162B, alongside and parallel to a first, a second, a third and a fourth electrode 70A, 70B, 72A, 72B, respectively, facing the longitudinal sides 157 of the frame structures 154, 155.

The longitudinal sides 157 facing the fifth electrode 170A and, respectively, the eighth electrode 172B are for example arranged at the second distance $d_2$ from said electrodes; likewise, the longitudinal sides 157, facing the sixth electrode 170B and, respectively, the seventh electrode 172A are for example arranged at the first distance $d_1$ from said electrodes.

In use, the further electrodes 170, 172 are biased at the first DC biasing voltage $V_1$. Moreover, the beam 65 and the frame structures 154, 155 are biased at the second voltage $V_2$.

As a result of biasing of the further electrodes 170A, 170B, 172A, 172B and of the frame structures 154, 155, the MEMS structure 142 is subject to a further total electrostatic force $F_{el}'$, which adds to the first total electrostatic force $F_{el}$.

The further electrodes 170A, 170B, 172A, 172B form, with the longitudinal sides 157 of the frame structures 154, 155, plates of further capacitors arranged in parallel with respect to the capacitors 73-1, 73-2, 73-3 and 73-4. The respective capacitances therefore add up, and the MEMS structure 142 here has a capacitance higher than that of the MEMS structure 42 of FIG. 3.

The MEMS structure 142 operates in a manner similar to what has been described with reference to FIGS. 3-5.

Figure 8:
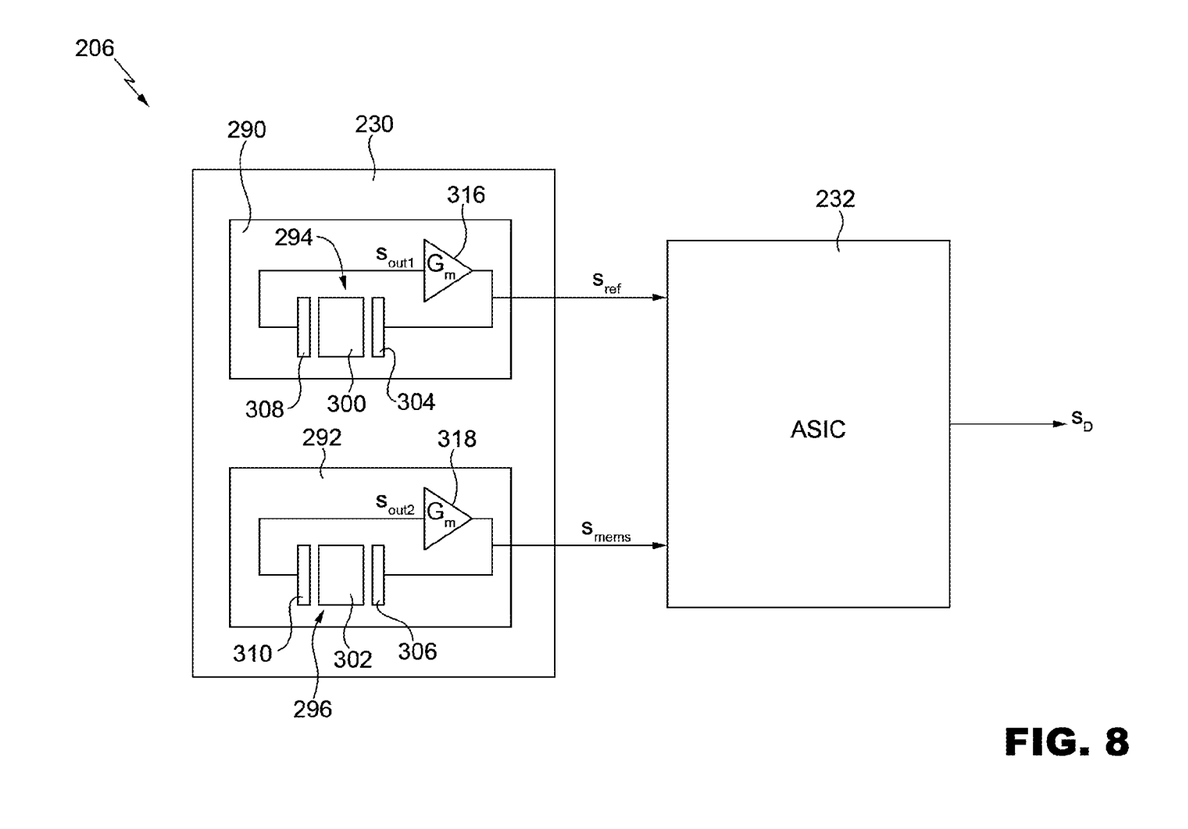
FIG. 8 is a simplified block diagram of the present input device and of the signal-processing circuit according to another embodiment.
Figure 9:
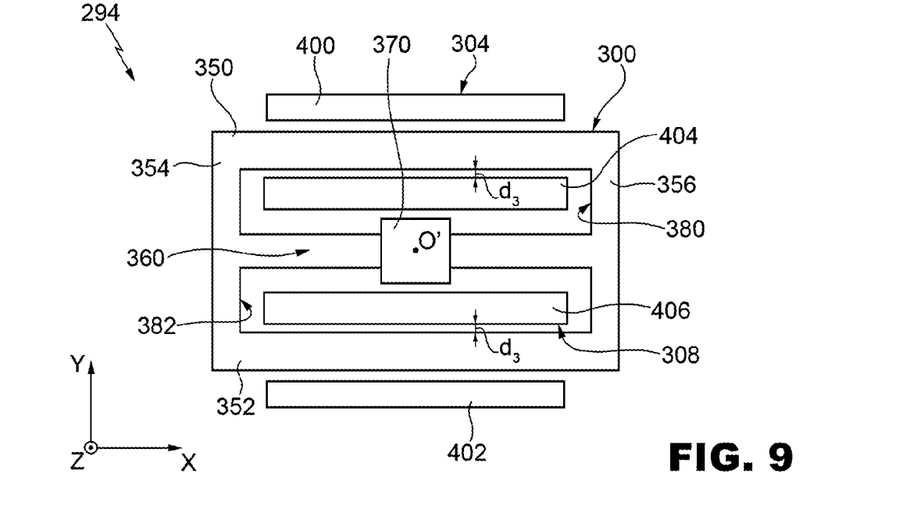
FIG. 9 is a top view of the structure of a reference oscillating circuit that can be used with the input device of FIG. 6.
Figure 10:
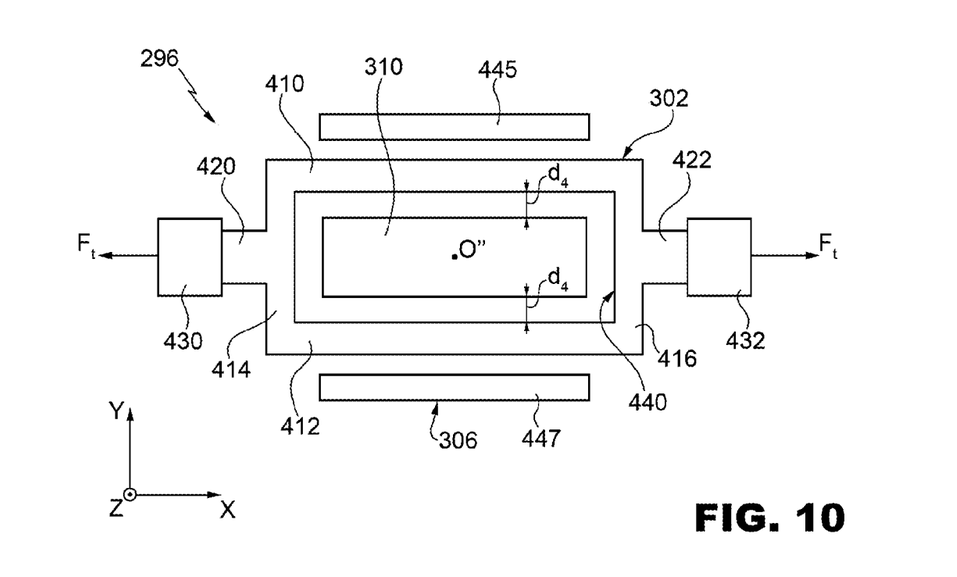
FIG. 10 is a top view of the structure of a different oscillating circuit that can be used with the input device of FIG. 6.

FIGS. 8-10 show a MEMS device 206 of a resonant capacitive type, wherein the capacitance variations are determined on the basis of resonance frequency variations.

With reference to FIG. 8, the MEMS device 206 comprises a MEMS block 230 and an ASIC block 232, connected to the MEMS block 230.

The MEMS block 230 comprises a reference oscillating circuit 290, generating a reference driving signal $s_{ref}$ and a measurement oscillating circuit 292, generating a measurement driving signal $s_{MEMS}$, said signals indicating respective resonance frequencies $f_{r1}$, $f_{r2}$. The oscillating circuits 290, 292 are each formed by a self-sustaining resonant loop (positive feedback) comprising an oscillating element 294, 296 and a driving stage 316, 318 (including respective current-to-voltage conversion stages, with gain Gm), which is connected to the respective oscillating element 294, 296.

In detail, each oscillating element 294, 296 comprises a respective mobile mass 300, 302, capacitively coupled to a respective driving electrode 304, 306 and to a respective sensing electrode 308, 310, as shown in detail in FIGS. 9 and 10 and further discussed hereinafter.

The driving stages 316, 318, provided in a per se known manner, for example by simple inverters to form a Pierce oscillator, receive, from the sensing electrodes 308, 310, respective output signals $s_{out1}$, $s_{out2}$ correlated to the capacitance variation of the capacitors formed between the sensing electrodes 308, 310 and the respective mobile masses 300, 302, a variation that is due to the resonance oscillation of the mobile masses 300, 302 themselves, as well as, possibly, further disturbance, including deformation of the MEMS device 206 as a result of the external force F, as discussed in detail hereinafter.

The driving stages 316, 318 therefore generate the driving signals $s_{ref}$, $s_{MEMS}$ (in some embodiments, AC voltages that, at equilibrium, have a frequency equal to the resonance frequency $f_{r1}$, $f_{r2}$, respectively, of the respective oscillating circuits 290, 292), and supply them to the respective driving electrodes 304, 306, so that the respective mobile masses 300, 302 (biased at DC voltages $V_{DC1}$, $V_{DC2}$) vibrate at their natural resonance frequency.

FIGS. 9 and 10 show the reference oscillating element 294 and the measurement oscillating element 296, respectively, of the MEMS block 230 of FIG. 8.

In some embodiments, in FIG. 9, the reference oscillating element 294 is, for example, a scissor-jack type circuit and has a structure similar to what is described in the European patent No. EP 3407492.

Here, the mobile mass 300 of the reference oscillating element 294 (hereinafter also referred to as reference mobile mass 300) has a resonance frequency equal to the first resonance frequency $f_{r1}$ and comprises a first and a second reference flexure arm 350, 352, parallel to each other and to the second axis X; a first and a second reference connection arm 354, 356, extending parallel to the third axis Y and connecting the ends of the reference flexure arms 350, 352 together; and a reference anchorage arm 360, extending parallel to the third axis Y, between the first and second reference flexure arms 350, 352, and is connected to the reference connection arms 354, 356 at central areas thereof. The reference anchorage arm 360 is anchored at the centre to a central anchorage 370, which is arranged at the centroid O' of the first oscillating element 294 and is fixed to one of the conduction regions 40 of the MEMS sensor 42 of FIG. 2.

The structure of the reference mobile mass 300 defines a first and a second reference window 380, 382, having a quadrangular (for example, rectangular) shape, delimited by the first and, respectively, the second reference flexure arm 350, 352 by respective portions of the first and, respectively, the second reference connection arm 354, 356 and by the reference anchorage arm 360.

The driving electrode 304 of the reference oscillating element 294 comprises a first and second reference driving electrode 400, 402, facing the first and, respectively, the second reference flexure arms 350, 352 and parallel thereto.

The reference sensing electrode 306 here comprises a first and a second reference measurement electrode 404, 406, facing the first and, respectively, the second reference flexure arms 350, 352 and are parallel thereto, and are arranged in the first and second reference windows 380, 382, respectively.

At rest, and in the absence of biasing, the reference flexure arms 350, 352 are set apart from the reference measurement electrodes 404, 406 by a same reference distance $d_3$ and form therewith two capacitors in parallel, having a total reference capacitance $C_R$.

In use, application of an a.c biasing voltage between the driving reference electrodes 400, 402 and the reference mobile mass 300 causes flexural deformations of the reference flexure arms 350, 352 in phase opposition and in opposite directions along the third axis Y at the first resonance frequency $f_{r1}$. The consequent approach/recession of the reference flexure arms 350, 352 with respect to the reference measurement electrodes 404, 406 causes a variation of the total reference capacitance $C_R$, and generation of the corresponding first output signal $s_{out1}$.

With reference to FIG. 10, the measurement oscillating element 296 is here a double-ended tuning-fork type circuit with double anchorage, sensitive to the external forces.

In FIG. 10, the mobile mass 302 of the measurement oscillating element 296 (hereinafter referred to also as mobile measurement mass 302) has a resonance frequency equal to the second resonance frequency $f_{r2}$, and comprises a first and a second measurement flexure arm 410, 412, extending parallel to the second axis X; a first and a second measurement connection arm 414, 416, extending parallel to the third axis Y and connect together the first and second measurement flexure arms 410, 412 at their ends; and a first and a second measurement anchorage arm 420, 422, extending parallel to the second axis X between the first and, respectively, the second measurement connection arm 414, 416, and a first and, respectively, a second measurement anchorage 430, 432. The measurement anchorages 430, 432 are fixed to one of the conduction regions 40 of FIG. 2.

The mobile measurement mass 302 delimits a measurement window 440, having, for example, a quadrangular (e.g., rectangular) shape and surrounds the measurement sensing electrode 310.

In this embodiment, the driving electrode 308 of FIG. 8 comprises a first and a second measurement driving electrode 445, 447, arranged parallel to the first and, respectively, the second measurement flexure arms 410, 412 externally to the mobile measurement mass 302.

At rest, and in the absence of biasing, the first and second measurement flexure arms 410, 412 are arranged at a same distance from the measurement sensing electrode 310, hereinafter referred to as measurement distance $d_4$. The first and second measurement flexure arms 410, 412 form, with the measurement sensing electrode 310, two capacitors in parallel, which have a total measurement capacitance CM.

In use, application of an a.c biasing voltage to the measurement driving electrodes 445, 447 with respect to the mobile measurement mass 302 causes flexural deformation of the measurement flexure arms 410, 412 in phase opposition and in opposite directions along the third axis Y at the second resonance frequency $f_{r2}$. The consequent approach/recession of the measurement flexure arms 410, 412 with respect to the measurement sensing electrode 310 causes a variation of the total measurement capacitance CM and generation of the second output signal $s_{out2}$.

Furthermore, the MEMS device 206 operates so as to detect the external force F that acts on the deformable portion 7 of the portable electronic apparatus 1 and therefore on the membrane 9 of the enclosure 2 of FIG. 1, as variation of the second resonance frequency $f_{r2}$ of the measurement oscillating element 296.

In some embodiments, as described for the MEMS sensor 42, deformation of the membrane 9 (FIG. 4) causes a tensile stress in the MEMS device 206, a stress that acts both on the reference oscillating element 294 and on the measurement oscillating element 296, but in a different manner.

In fact, the reference oscillating element 294 is insensitive to the deformation of the membrane 9 since the reference mobile mass 300 is fixed to the single reference anchorage 370, and therefore moves rigidly with the latter when the membrane 9 is deformed as a result of the external force F. Consequently, the reference mobile mass 300 is not deformed by the tensile force $F_t$ generated by deformation of the membrane 9, and the first resonance frequency $f_{r1}$ of the flexure arms 350, 352 does not vary substantially.

Instead, the tensile force $F_t$ causes a deformation of the mobile measurement mass 302 of the measurement oscillating element 296; in some embodiments, as described above with reference to FIG. 4, it acts in opposite directions on the measurement anchorages 430, 432, which displace with respect to their position in the absence of external forces. In some embodiments, the measurement anchorages 430, 432 undergo a translation along the second axis X in opposite directions so as to move away from the centroidal axis O" of the measurement oscillating element 296. In practice, the mobile measurement mass 302 is "stretched" in a direction parallel to the second axis X as a result of the axial load exerted on the beams 410 and 412 generated by the external force F.

As a result of deformation of the mobile measurement mass 302, the distance between the measurement flexure arms 410, 412 and the sensing electrode 310 varies with respect to the movement of actuation, thus causing an increase in the stiffness of the measurement flexure arms 410, 412. Consequently, also the second resonance frequency $f_{r2}$ varies according to what is described in the Italian patent No. 1407689 (corresponding to the U.S. Pat. No. 9,377,482). The measurement driving stage 312 therefore modifies the measurement driving signal $s_{MEMS}$ thereof so as to keep the mobile measurement mass 302 in a state of oscillation at the second resonance frequency $f_{r2}$.

The thus obtained driving signals $s_{ref}$, $s_{MEMS}$ are supplied to the ASIC block 232 (FIG. 8), which processes them so as to generate a digital signal $s_{D,ris}$ indicating the external force F acting on the deformable portion 7 of the apparatus 1 of FIG. 1. Basically, the ASIC block 232 counts the cycles of the measurement driving signal $s_{MEMS}$ generated by the measurement oscillating circuit 292 and compares them with the cycles of the reference driving signal $s_{ref}$ generated by the reference oscillating circuit 290. Detection of a change in the number of cycles of the measurement driving signal $s_{MEMS}$ with respect to the number of cycles of the reference driving signal $s_{ref}$ enables detection of whether an external force F has been exerted on the deformable portion 7.

Figure 11:
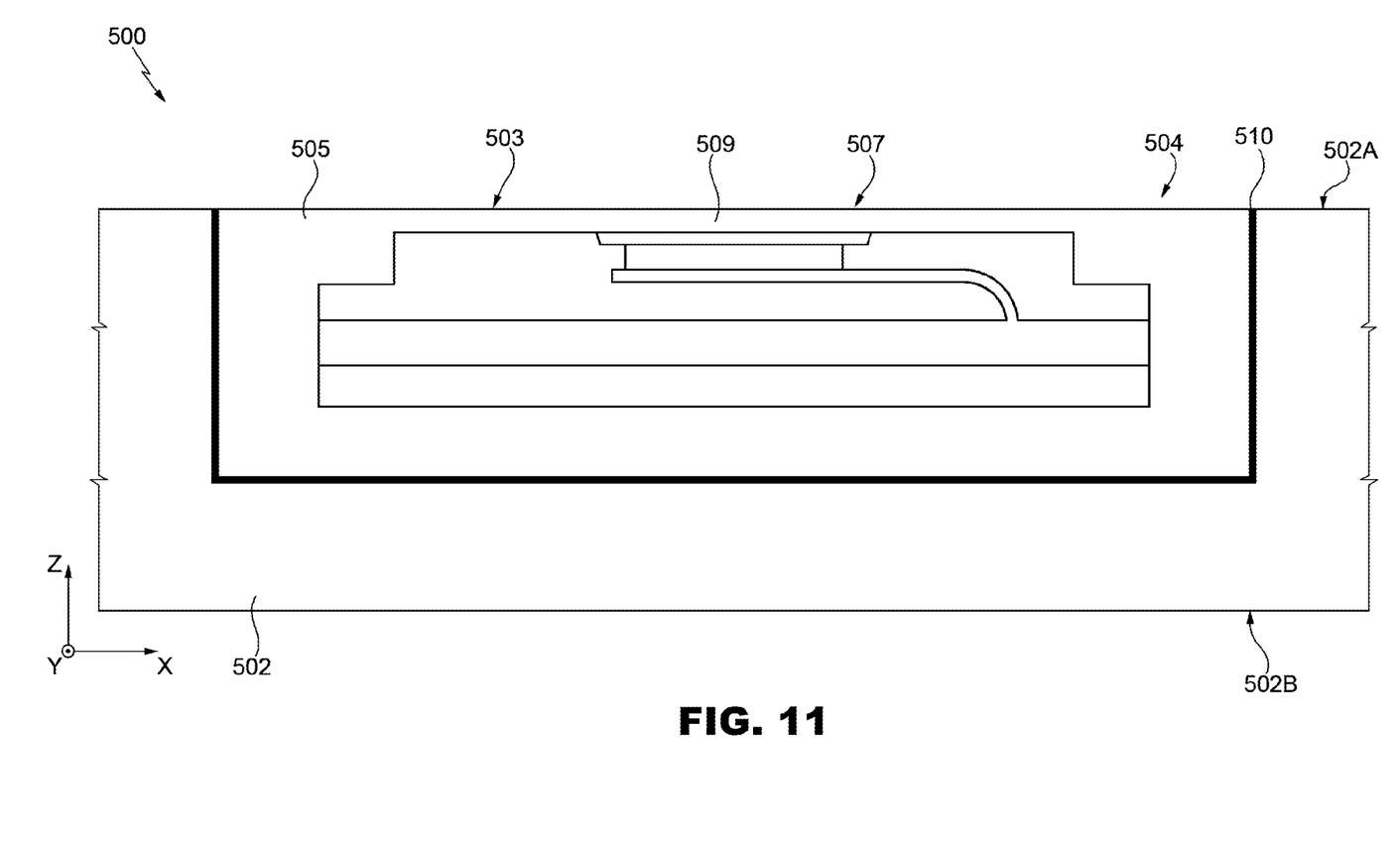
FIG. 11 shows a further embodiment of the portable electronic apparatus and of the present input device.

FIG. 11 shows a different embodiment of the portable electronic apparatus. In some embodiments, FIG. 11 shows a portable electronic apparatus 500 having a general structure similar to that of the portable electronic apparatus 1 of FIG. 1.

In some embodiments, the portable electronic apparatus 500 comprises a body 502, for example of aluminium, having a first and a second body surface 502A, 502B, and a recess 504, extending in the body 502 starting from the first body surface 502A and accommodating an input device (key element) 503.

The input device 503 comprises a housing 505, arranged in the recess 504 and having a flexible portion 507, which is similar to the flexible portion 7 of FIG. 1 and has a membrane 509. In some embodiments, the input device 503 is fixed in the recess 504 by a bonding layer 510, for example, a layer of glue.

For the rest, the input device 503 may be manufactured in a manner similar to what has been described with reference to FIGS. 1-10. In some embodiments, in this case, electrical signals may be exchanged in a wireless mode with electronic circuits and devices arranged externally to the input device 503.

The MEMS sensor and the corresponding input device have various advantages.

In some embodiments, the MEMS sensor has a low power consumption since the biasing voltages used for operating the MEMS device are low.

Furthermore, it is completely accommodated in a housing (in the enclosure 2 of FIG. 1, the housing 505 of FIG. 11) not accessible from outside, at the end of the manufacturing process; thus, the MEMS sensor is perfectly resistant to water or other liquids, thus without any need to provide sealing elements (for example, O-rings) designed to isolate it from the external environment.

The MEMS sensor overall has small dimensions; for example, it may be manufactured with an overall thickness of less than 500 µm, and can thus also be used in electronic devices of small dimensions, such as a smartwatch or a smartphone.

In addition, the detection principle of the MEMS device 6, 206 allows to have a good linearity in the response to deformation of the membrane 9, 509, as well as a greater accuracy in determination of the external force F acting thereon; in some embodiments, the present Applicant has verified that the capacitive variation of the MEMS device 6, 206 is directly proportional to the deformation of the membrane 9.

Moreover, the detection principle of the MEMS device 6, 206 allow to have a good yield.

In addition, with reference to the embodiment of FIGS. 8-10, the MEMS sensor 230 operates at low resonance frequencies, thus reducing the levels of power consumption, without, however, this implying any loss in terms of accuracy and sensitivity of measurement. Moreover, the use of a first oscillating circuit 294, which operates as reference oscillating circuit, enables elimination of the dependence of the variation of the Young's modulus of silicon upon temperature variations, thus enabling more reliable measurements to be made.

Furthermore, the MEMS device 6, 206 may be manufactured using techniques or steps commonly used in the manufacture of MEMS devices, therefore at comparable costs.

Finally, it is clear that modifications and variations may be made to the MEMS device, to the MEMS input device, and to the corresponding electronic apparatus described and shown herein, without thereby departing from the scope of the present disclosure.

For instance, the MEMS sensor may be mounted in an opposite manner, i.e., with the substrate 20 or the MEMS sensor 30 fixed directly to the sensitive portion 7, with an appropriate arrangement of the structures for connection to the boards 15, 17.

Moreover, in the embodiment of FIG. 10, the position of the driving electrodes 445, 447 and of the measurement electrode 310 may be swapped round, arranging the driving electrodes within the measurement window 440 and two measurement electrodes 310 on the outside of the measurement window 440, each facing one of the flexure arms 410, 412.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a MEMS (Microelectromechanical system) button having a MEMS sensor, the MEMS sensor including a MEMS strain detection structure and a deformable portion configured to undergo deformation in response to an external force, the MEMS strain detection structure including:
a mobile element;
a first anchorage and a second anchorage, both the first and second anchorages rigid with respect to the deformable portion and configured to displace and generate a deformation force ($F_t$) on the mobile element in response to the external force; and
a first electrode and a second electrode capacitively coupled to the mobile element, the first anchorage between the first and second electrodes on a first side of the mobile element, a displacement of the mobile element causing a capacitance variation between the mobile element and the first and second electrodes, the MEMS sensor configured to generate a detection signal based on the capacitance variation.

2. The device according to claim 1, wherein the mobile element comprises:
a beam, configured to rotate about a rotation axis in response to the deformation force, the beam having a first half beam and a second half beam;
a first arm extending between and coupling the first half beam and the first anchorage;
a second arm extending between and coupling the second half beam and the second anchorage, the first and the second arms being in an eccentric position with one another and generating a torque on the beam when subject to the deformation force.

3. The device according to claim 2, wherein the first and second electrodes are facing and capacitively coupled to the first and the second half beams, respectively.

4. The device according to claim 3, wherein the mobile element comprises:
a first frame structure rigid with respect to the first half beam and surrounding the first electrode and a third electrode; and
a second frame structure rigid with respect to the second half beam and surrounding the second electrode and a fourth electrode, wherein the first frame structure is arranged parallel to the second frame structure, and the first half beam opposite to the second half beam with the first and second anchorages between the first and second frame structures.

5. The device according to claim 4, wherein the first and second frame structures comprise:
respective longitudinal sides, arranged in parallel to the beam and symmetrically with respect to the beam; and
respective transverse sides extending in a direction transverse to the longitudinal sides,
wherein the first and second frame structures define first, second, third, and fourth openings configured to surround the first, second, third, and fourth electrodes, respectively.

6. The device according to claim 5, comprising fifth and sixth electrodes in the first and in the second openings and laterally adjacent to and in parallel to the first and third electrodes, respectively, the fifth and sixth electrodes directly facing and being capacitively coupled to the longitudinal sides, respectively.

7. The device according to claim 1, comprising a MEMS block that comprises a measurement oscillating element including:
a first and a second measurement flexure arm, each having a first and a second end, the first and second measurement flexure arms being capacitively coupled to measurement electrodes, and being configured to oscillate at a measurement resonance frequency;
a first and a second measurement connection arms, the first measurement connection arm coupling the first ends of the first and the second measurement flexure arms together, and the second measurement connection arm coupling the second ends of the first and the second measurement flexure arms together so as to form a measurement window; and
a first measurement anchorage arm and a second measurement anchorage arm, each extending between a respective one of the first and second measurement connection arms and a respective anchorage.

8. The device according to claim 7, wherein the measurement electrodes comprise:
a first measurement driving electrode and a second measurement driving electrode, facing and capacitively coupled to the first measurement flexure arm and the second measurement flexure arm, respectively; and
at least a measurement sensing electrode, facing and capacitively coupled to at least one of the first and second measurement flexure arms.

9. The device according to claim 8, wherein the measurement sensing electrode is arranged in the measurement window, and the first and second measurement driving electrodes are arranged outside the measurement window and each facing a respective one of the first and second measurement flexure arms.

10. The device according to claim 7, wherein the MEMS block includes a positive self-sustaining resonant feedback loop that includes the mobile element and a driving stage having an input coupled to the measurement sensing electrode and an output coupled to the first and second measurement driving electrodes.

11. The device according to claim 7, wherein the MEMS block further comprises a reference oscillating element including:
reference electrodes;
a central anchorage;
a first reference flexure arm and a second reference flexure arm, each having a first and a second end, the first and the second reference flexure arms being configured to oscillate at a reference resonance frequency and be capacitively coupled to the reference electrodes;
a first reference connection arm and a second reference connection arm, the first reference connection arm connecting the first ends of the first and the second reference flexure arms together, and the second reference connection arm connecting the second ends of the first and the second reference flexure arms together; and
a reference anchorage arm extending between the first and the second reference connection arms and is connected to the central anchorage, the reference flexure arms, the reference anchorage arm and the first and second reference connection arms defining a first reference-electrode opening and a second reference-electrode opening.

12. The device according to claim 11, wherein the reference electrodes comprise:
- a first sensing electrode and a second sensing electrode, each facing and being capacitively coupled to the first and the second reference flexure arms, respectively, the first and second reference sensing electrodes being arranged in the first and the second reference electrode openings, respectively; and
- a first reference driving electrode and a second reference driving electrode, each facing and being capacitively coupled to the first and second reference flexure arms, respectively.

13. The device according to claim 11, wherein the MEMS block includes a positive self-sustaining resonant feedback loop that includes the reference oscillating element and a reference driving stage having an input coupled to the measurement sensing electrode and an output coupled to the first and second measurement driving electrodes.

14. The device according to claim 1, comprising a processing circuit configured to receive and process the detection signal from the MEMS sensor to generate an output signal.

15. The device according to claim 1, comprising a cap fixed to the deformable portion and surrounding the MEMS strain detection structure; and wherein the deformable portion includes electrical-connection regions and conductive paths electrically coupled to the MEMS strain detection structure.

16. The device according to claim 15, further comprising:
- a supporting substrate, fixed to the deformable portion; and
- an electronic processing circuit that is supported by the supporting substrate and is electrically coupled to the MEMS strain detection structure via the electrical-connection regions and the conductive paths.

17. A device, comprising:
- a MEMS (Microelectromechanical system) button device;
- a housing having a cavity and a deformable portion, the cavity including the MEMS button device, the deformable portion overlapping the cavity and directly contacting the MEMS button device; and
- a connection structure in the cavity, the connection structure including a connector, a first board coupled to the housing, and a second board coupled to the first board via the connector, the MEMS button device on the second board;
- wherein the MEMS button device includes:
  - a MEMS sensor having a MEMS strain detection structure;
  - a first anchorage;
  - a second anchorage;
  - a deformable base configured to undergo deformation in response to an external force;
  - a mobile element coupled to the deformable base via the first anchorage and the second anchorage, the mobile element configured to move in response to the deformation of the deformable base; and
  - a first electrode and a second electrode capacitively coupled to the mobile element, the first anchorage between the first and second electrodes on a first side of the mobile element, a motion of the mobile element causing a capacitance variation between the mobile element and the first and second electrodes.

18. The device of claim 17, wherein the first board is coupled to a sidewall of the cavity and is spaced away from a bottom surface of the cavity, the bottom surface of the cavity facing the deformable portion.

19. A device, comprising:
- a cavity;
- a MEMS (Microelectromechanical system) button having a MEMS sensor in the cavity;
- a deformable membrane overlapping the cavity; and
- a MEMS strain detection sensor in the MEMS sensor of the cavity;
- wherein the MEMS strain detection sensor includes:
  - a first anchorage;
  - a deformable base;
  - a mobile element coupled to the deformable base via the first anchorage; and
  - a first electrode and a second electrode capacitively coupled to the mobile element, the first anchorage adjacent to the first and second electrodes on a first side of the mobile element.

20. The device of claim 19, wherein the MEMS strain detection sensor includes a second anchorage and the mobile element is configured to rotate in response to the deformation of the deformable base.

* * * * *